United States Patent
Kobayashi et al.

(10) Patent No.: US 11,850,925 B2
(45) Date of Patent: Dec. 26, 2023

(54) CONTROL APPARATUS OF DOOR FOR VEHICLE

(71) Applicant: AISIN CORPORATION, Aichi (JP)

(72) Inventors: Saya Kobayashi, Kariya (JP); Haruki Tsuji, Kariya (JP)

(73) Assignee: AISIN CORPORATION, Kariya (JP)

( * ) Notice: Subject to any disclaimer, the term of this patent is extended or adjusted under 35 U.S.C. 154(b) by 768 days.

(21) Appl. No.: 17/010,414

(22) Filed: Sep. 2, 2020

(65) Prior Publication Data
US 2021/0061072 A1    Mar. 4, 2021

(30) Foreign Application Priority Data

Sep. 4, 2019   (JP) .................... 2019-160979

(51) Int. Cl.
*B60J 5/04*   (2006.01)
*E05F 15/75*   (2015.01)
*H03K 17/96*   (2006.01)

(52) U.S. Cl.
CPC .............. *B60J 5/0468* (2013.01); *E05F 15/75* (2015.01); *H03K 17/962* (2013.01); *E05Y 2400/44* (2013.01); *E05Y 2400/86* (2013.01); *E05Y 2900/531* (2013.01); *E05Y 2900/546* (2013.01)

(58) Field of Classification Search
CPC ...... B60J 5/0468; E05F 15/75; H03K 17/962; H03K 2017/9613; E05Y 2400/44; E05Y 2400/86; E05Y 2900/531; E05Y 2900/546; E05B 81/64; E05B 81/76
See application file for complete search history.

(56) References Cited

U.S. PATENT DOCUMENTS

2021/0123270 A1*   4/2021   Spick .................... E05B 81/76

FOREIGN PATENT DOCUMENTS

CN    105247790 A    1/2016
JP    2010-239587 A   10/2010

OTHER PUBLICATIONS

Combined Chinese Office Action and Search Report dated Aug. 19, 2022 in Chinese Patent Application No. 202010914656.X, 8 pages.

* cited by examiner

*Primary Examiner* — Yuen Wong
(74) *Attorney, Agent, or Firm* — Oblon, McClelland, Maier & Neustadt, L.L.P.

(57) ABSTRACT

A control apparatus of a door for a vehicle includes a first electrode corresponding to an electrostatic sensor electrode including a first detection surface, and a second electrode corresponding to an electrostatic sensor electrode including a second detection surface including an overlapping region which overlaps with the first detection surface and a non-overlapping region. The control apparatus includes a control portion configured to switch between a first detection state in which the first electrode is driven and an electric potential of the second electrode is at a float, and a second detection state in which the second electrode is driven and an electric potential of the first electrode is in a grounded state, and configured to identify an action instruction to the door for the vehicle on the basis of an electrostatic capacitance value measured at the first electrode and the second electrode.

20 Claims, 6 Drawing Sheets

F I G. 3
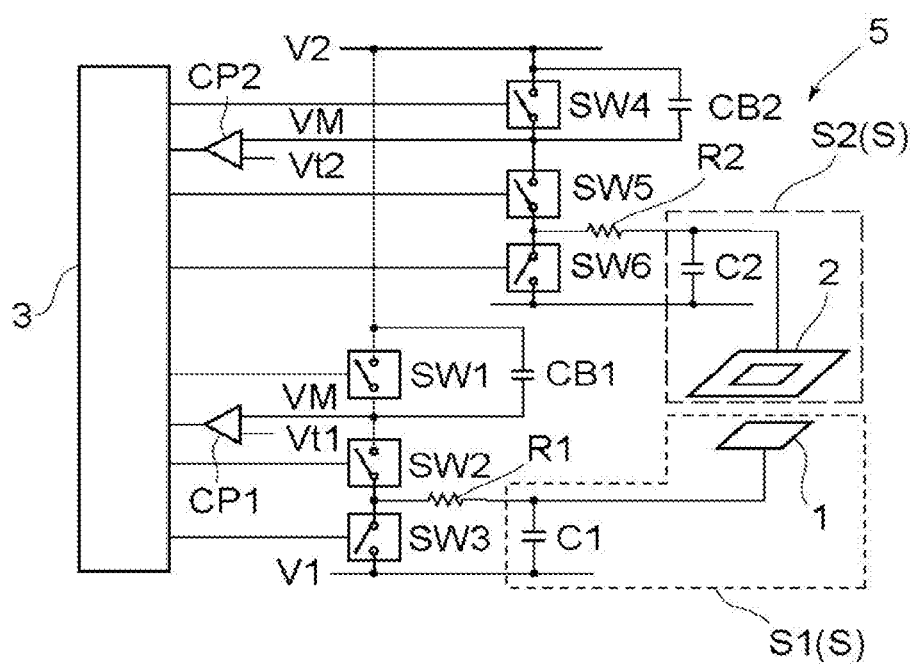

CONTROL APPARATUS OF DOOR FOR VEHICLE

CROSS REFERENCE TO RELATED APPLICATIONS

This application is based on and claims priority under 35 U.S.C. § 119 to Japanese Patent Application 2019-160979, filed on Sep. 4, 2019, the entire content of which is incorporated herein by reference.

TECHNICAL FIELD

This disclosure generally relates to a control apparatus of a door for a vehicle.

BACKGROUND DISCUSSION

A known control apparatus of a door for a vehicle may include two electrostatic sensor electrodes provided to face an outer side of the door for the vehicle, and a control portion controlling the electrostatic sensor electrodes, and the known control apparatus detects door opening and closing instructions by a user. For example, a known control apparatus of a door for a vehicle including the above-described configuration is described in JP2010-239587A (which will be hereinafter referred to as Patent reference 1) (for example, in paragraphs from [0038] to [0041] and from [0057] to [0059] of Patent reference 1).

For example, the known control apparatus of a door for a vehicle includes a sensor electrode including a rectangular shape and arranged at a central side, and an auxiliary electrode arranged around the sensor electrode. The sensor electrode detects a detection subject including a person existing at a detection surface-side. The auxiliary electrode causes an equal-electrostatic-capacitance-line at the detection surface-side of the sensor electrode to be changed, thereby allowing each of the electrodes to include directivity.

For the two electrodes, a CPU switches operation modes. In a first operation mode, only the sensor electrode is used for the detection and the auxiliary electrode functions as a shield drive circuit. In this case, a sensor including the directivity relative to the detection subject is formed. In a second operation mode, both the sensor electrode and the auxiliary electrode are used for the detection, which allows the detection of a detection subject in a larger range.

As described above, the sensors including different directivities are formed alternately. The detection subject existing in the vicinity of the door for the vehicle is distinguished, for example, an adult and a child from each other, and a door lock control and/or a door opening and closing control is performed.

At the known control apparatus of a door for a vehicle of Patent reference 1, the sensor electrode and the auxiliary electrode are arranged on the same surface or on different surfaces from each other, and the sensor electrode and the auxiliary electrode are arranged not to overlap with each other when viewed perpendicularly to the surface directions of the sensors. Thus, to allow each of the the sensor electrode and the auxiliary electrode to function in a detection state, both of the sensors need to be electrified in the detection state to ensure a detection area.

In addition, since the both electrodes include completely separated arrangement spaces, an area which is equal to or greater than an area obtained by adding the both sensors to each other is needed as a size of the sensor. Accordingly, a size reduction of the sensor is limited.

A need thus exists for a control apparatus of a door for a vehicle which is not susceptible to the drawback mentioned above.

SUMMARY

According to an aspect of this disclosure, a control apparatus of a door for a vehicle includes a first electrode corresponding to an electrostatic sensor electrode including a first detection surface facing an outer side of a door for a vehicle, and a second electrode opposing the first electrode, being positioned at an outer side of the door for the vehicle relative to the first detection surface, and facing the outer side of the door for the vehicle. The second electrode corresponds to an electrostatic sensor electrode including a second detection surface including an overlapping region which overlaps with the first detection surface along surface directions of the first detection surface and the second detection surface, and a non-overlapping region which does not overlap with the first detection surface. The control apparatus of a door for a vehicle includes a control portion configured to control the first electrode and the second electrode, wherein the control apparatus is configured to switch between a first detection state in which the first electrode is driven and an electric potential of the second electrode is at a float, and a second detection state in which the second electrode is driven and an electric potential of the first electrode is in a grounded state, and the control apparatus is configured to identify an action instruction to the door for the vehicle on the basis of an electrostatic capacitance value measured at the first electrode and the second electrode.

BRIEF DESCRIPTION OF THE DRAWINGS

The foregoing and additional features and characteristics of this disclosure will become more apparent from the following detailed description considered with the reference to the accompanying drawings, wherein:

FIG. 3 is an explanatory diagram illustrating a configuration of a drive circuit of the control apparatus of a door for a vehicle according to the first embodiment;

DETAILED DESCRIPTION (First embodiment) (Overview) FIGS. 1A, 1B and 1C illustrate a configuration of a control apparatus U of a door for a vehicle (which will be hereinafter simply referred to as "control apparatus U") according to a first embodiment disclosed here. FIG. 2 schematically illustrates a detection manner of the control apparatus U. The control apparatus U is provided at a door handle H of a vehicle, inside a door peripheral component of a vehicle, and/or inside a design component of an exterior material of a vehicle, for example. The control apparatus U is configured to detect opening and closing operations of a door D for a vehicle which are performed by a user of the vehicle, including opening and closing operations performed by directly touching a sensor S and/or opening and closing operations performed by waving a hand in a state in which the user is away from the sensor S, for example. The sensor S needs a small installation region. The control apparatus U will be explained below with reference to the drawings.

FIGS. 1A, 1B and 1C illustrate examples in which the control apparatus U is provided at the door handle H of a sliding door D1 serving as the door D for a vehicle. FIG. 1A shows a position of the door handle H. FIG. 1B is a partial cross-sectional front view showing part of the door handle H. FIG. 1C is a partial cross-sectional foreside view of the door handle H. The control apparatus U includes two kinds of electrostatic sensor electrodes, that is, a first electrode 1 and a second electrode 2, and a control portion 3 controlling operations of the electrodes. The first electrode 1 is arranged to face an outer side of the door. The second electrode 2 is arranged at an outer side of the first electrode 1 in a state where the second electrode 2 partly overlaps with the first electrode 1.

Figure 1A:
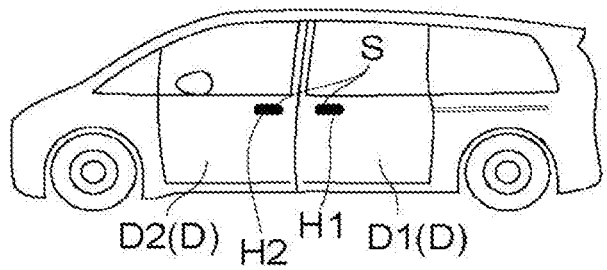
FIG. 1A is an explanatory diagram illustrating a configuration of a control apparatus of a door for a vehicle according to embodiments disclosed here.
Figure 1B:
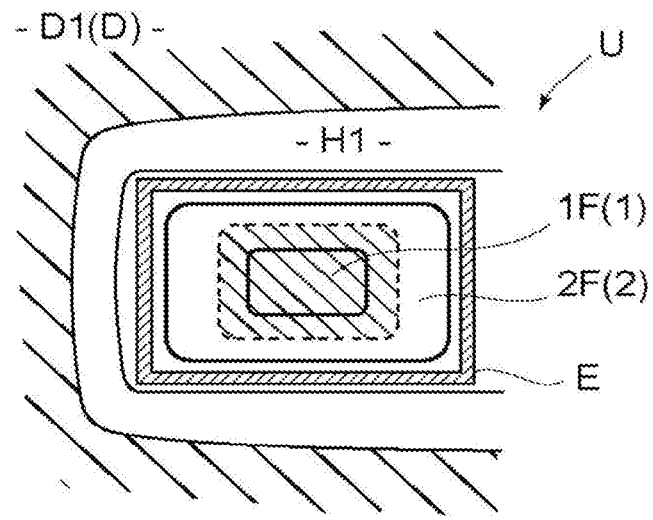
FIG. 1B is an explanatory diagram illustrating a configuration of the control apparatus of a door for a vehicle according to a first embodiment disclosed here.

(First electrode) The first electrode 1 includes a thin film configuration, and is formed in a substantially rectangle shape conforming to a shape of an installation region of the door handle H as illustrated in FIG. 1B, for example. The first electrode 1 is housed or accommodated inside a case E together with the second electrode 2 and the control portion 3, for example. The case E is attached to an inside of the door handle H. The first electrode 1 includes a first detection surface 1F corresponding to a surface facing the outer side of the door handle H. The first electrode 1 mainly detects a finger and/or a hand positioned in a direction which is perpendicular to the first detection surface 1F, and detects or senses actions of opening and closing commands made relative to the sliding door D. For example, when a finger of the user approaches the first detection surface 1F, an electrostatic capacitance between the first detection surface 1F and the finger changes, and then the existence of the finger is identified in accordance with magnitude of a degree of the changes.

Figure 2A:
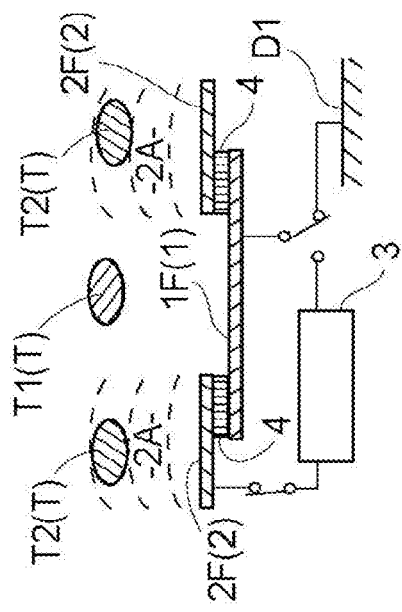
FIG. 2 is an explanatory diagram showing functions of electrodes according to the first embodiment.

The control apparatus U of the embodiment switches drive states of the first electrode 1 and the second electrode 2, and obtains two kinds of detection states. As illustrated in FIG. 2A, a state in which the first electrode 1 is mainly driven to allow the first electrode 1 and the second electrode 2 to work together with each other to perform the detection is referred to as a first detection state. A region corresponding to a space region which is in the vicinity of the first electrode 1 and in which a detection subject or target T, including a finger, is detectable in the first detection state is referred to as a first detection region 1A.

Figure 1C:
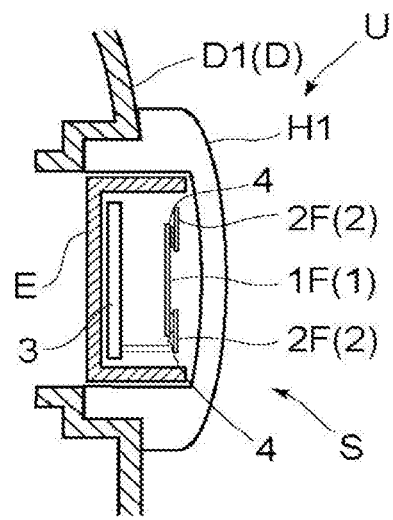
FIG. 1C is an explanatory diagram illustrating a configuration of the control apparatus of a door for a vehicle according to the first embodiment.

In the examples illustrated in FIGS. 1A, 1B and 1C, the first electrode 1 is in a state in which the surroundings or periphery of the first electrode 1 is surrounded by the second electrode 2, and an area of the first electrode 1 is set at a relatively limited size. This is because the user intentionally approaches his or her finger and/or hand to the first electrode 1 when the user gives the command of opening and closing operation of the door. That is, in the first detection state, the finger or the like in the vicinity of the first electrode 1 needs to be detected, and accordingly the first electrode 1 does not need to include a particularly large area.

(Second electrode) The second electrode 2 is an electrostatic capacitance sensor electrode similar to the first electrode 1. The second electrode 2 detects or senses a finger and/or hand of the user which is in contact with or comes close to the second electrode 2. The second electrode 2 detects the detection subject T cooperatively with the first electrode 1 in the first detection state. Accordingly, the second electrode 2 faces or opposes the first electrode 1 and is arranged at the outer side of the door relative to the first detection surface 1F. Therefore, the second electrode 2 is positioned in the lines of electric force generated from the first detection surface 1F towards the detection subject T when the first electrode 1 is supplied with electricity, and thus the first electrode 1 and the second electrode 2 come to be at the same potential, that is, be equipotential to each other. That is, the electrostatic capacitances of the both electrodes are added to each other and the detection region is increased.

In the examples illustrated in FIGS. 1A, 1B and 1C, the second electrode 2 includes a rectangular ring shape and is arranged in a state of surrounding the periphery of the first electrode 1. The first electrode 1 is visually recognizable through the opening of the second electrode 2. In the present embodiment, by arranging the second electrode 2 to overlap with the entire region of an outer peripheral edge portion of the first electrode 1, a second detection region 2A is formed in a second detection state. The second detection region 2A includes an annular shape of which the center corresponds to the first electrode 1.

The second electrode 2 includes an overlapping region in which the second electrode 2 overlaps with the first electrode 1 and a non-overlapping region in which the second electrode 2 does not overlap with the first electrode 1. In the examples illustrated in FIGS. 1B and 1C, the first electrode 1 and the second electrode 2 overlap with each other in the peripheral edge of the first electrode 1 but only the second electrode 2 exists at an outer side relative to the peripheral edge portion of the first electrode 1.

In the present configuration, as illustrated in FIG. 2A, the first electrode 1 is controlled by the control portion 3 to be electrified and the second electrode 2 is in a floating state, that is, the potential of the second electrode 2 is open and independent (not set or determined) in the first detection state. Accordingly, the first electrode 1 and the second electrode 2 are allowed to be at the same potential, thereby obtaining the larger first detection region 1A. Thus, the detection subject T existing in the large first detection region 1A is detectable in a case where a finger of the user positively or intentionally approaches the first electrode 1 (a first detection subject T1 in FIG. 2A) as well as in a case where a hand of the user comes close to the door handle H and/or touches the vicinity of the door handle H (a second detection subject T2 in FIG. 2A).

Figure 2B:
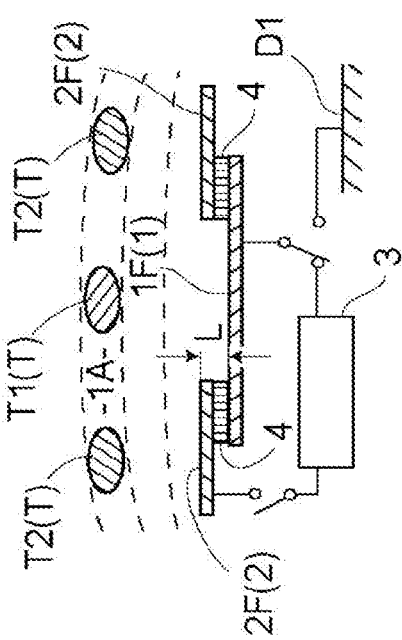

On the other hand, the second electrode 2 detects the detection subject T with the use only of the second electrode 2. As illustrated in FIG. 2B, the first electrode 1 is grounded to the sliding door D1, and the second electrode 2 is connected to the control portion 3 and is supplied with the electricity. The above-explained state is referred to as the second detection state. In the second detection state, the second detection subject or target T2 existing in the second detection region 2A corresponding to a space portion in the vicinity of the second electrode 2 is detectable.

As illustrated in FIG. 2B, the second detection region 2A in the second detection state corresponds to a substantially annular region at the periphery of the first electrode 1. Thus, the detection is performed on the detection subject T (the second detection subject T2 in FIG. 2B) positioned away from the first electrode 1.

According to the present configuration, first, the hand and/or finger of the user existing nearby is identifiable in the large first detection region 1A (the first detection subject T1 and the second detection subjects T2 in FIG. 2A), and subsequently, the existence of the hand and/or finger in the second detection region 2A that corresponds to an outward region except the central portion of the first detection region 1A (the the second detection subjects T2 in FIG. 2B) is detectable. By comparing these detection results, the position of the detection subject T is identified.

In order to facilitate the first electrode 1 and the second electrode 2 to be at the same potential as each other in the first detection state, dielectric 4 may be provided at at least part of the overlapping portion of the first electrode 1 and the second electrode 2. For example, epoxy glass and/or various potting materials including urethane, silicone and/or epoxy potting material, which include a high relative permittivity may be used as the dielectric body 4. An air layer or air space may be provided as the dielectric 4, for example.

(Overlapping area of both the electrodes) The second electrode 2 may include an arbitrary size and may be configured to be larger compared to the area of the first electrode 1 as illustrated in FIGS. 1B and 1C, for example. That is, the first detection region 1A is formed in the region in which the first electrode 1 and the second electrode 2 are overlapped and added to each other in the first detection state, and accordingly it may be ideal that the second electrode 2 is large in order to detect the existence of the detection subject T quickly.

For example, an overlapping area of the first detection surface 1F and the second detection surface 2F may be ideally equal to or greater than one quarter of an area of the second detection surface 2F. According to the above described configuration, the first electrode 1 and the second electrode 2 easily become at the same potential as each other in the first detection state. As a result, detection sensitivity of the same degree is obtained in the entire region surrounded by the overall outline of the first electrode 1 and the second electrode 2 combined with each other. Accordingly, an action instruction made by the user to the sliding door D1 is detected more reliably.

(Distance between the electrodes) A distance L (which is illustrated in FIG. 2A) between the first detection surface F1 and the second detection surface F2 in a direction which is orthogonal to an overlapping direction of the first detection surface F1 and the second detection surface 2F may be ideally 5 mm or less. With the distance L of 5 mm or less, the first electrode 1 and the second electrode 2 easily include the same potential as each other in the first detection state, thereby enhancing the detection sensitivity even more.

(Drive circuit) For example, switching between the first detection state and the second detection state is performed with the use of a drive circuit 5 illustrated in FIG. 3. The drive circuit 5 is provided with a first sensor S1 including the first electrode 1 and a first capacitor C1, a second sensor S2 including the second electrode 2 and a second capacitor C2, and the control portion 3 controlling the above-described sensors and capacitors, for example. The control apparatus U makes the first electrode 1 to function and makes the second electrode 2 to be in the floating state in the first detection state, and makes the first electrode 1 to be in the grounded state in the second detection state.

A state of of the first sensor S1 is determined by a connection state of a first switch SW1, a second switch SW2 and a third switch SW3, and a first reference capacitor CB1 to one another. A detected electric potential of the detection subject T which is detected by the first electrode 1 is determined by a first determination apparatus CP1 corresponding to a comparator. On the other hand, a state of the second sensor S2 is determined by a connection state of a fourth switch SW4, a fifth switch SW5 and a sixth switch SW6, and a second reference capacitor CB2 to one another. A detected electric potential of the detection subject T which is detected by the second electrode 2 is determined by a second determination apparatus CP2 corresponding to a comparator.

For example, the first sensor S1 is connected in series between an electric power source (potential V2) and a member (potential V1) at the low-potential-side including the sliding door D1, so as to be positioned at the low-potential-side relative to the first reference capacitor CB1. Similarly, the second sensor S2 is connected in series between the electric power source (potential V2) and the sliding door D1, so as to be positioned at the low-potential-side relative to the second reference capacitor CB2. As the detection subject T comes close to and away from the first electrode 1 and the second electrode 2, the electrostatic capacitances of the first sensor S1 and the second sensor S2 change.

The first switch SW1 is connected in parallel to the first reference capacitor CB1. The second switch SW2 is connected between the first reference capacitor CB1 and the first electrode 1. A first end of the second switch SW2 is connected to the first reference capacitor CB1, and a second end of the second switch SW2 is connected to the first electrode 1 via a resistance R1. The second end of the second switch SW2 is connected to the sliding door D1 via the third switch SW3. A first end of the third switch SW3 is connected to the first electrode 1 via the resistance R1 and a second end of the third switch SW3 is connected to the sliding door D1. The fourth switch SW4, the fifth switch SW5 and the sixth switch SW6 include the configurations similar to the above-described configurations.

For example, the first determination apparatus CP1 compares intermediate potential VM at an intermediate position between the first reference capacitor CB1 and the first sensor S1, with a first set potential Vt1. An initial signal is outputted when the intermediate potential VM is equal to or greater than the first set potential Vt1. A completion signal is outputted when the intermediate potential VM is smaller than the first set potential Vt1.

Figure 4:
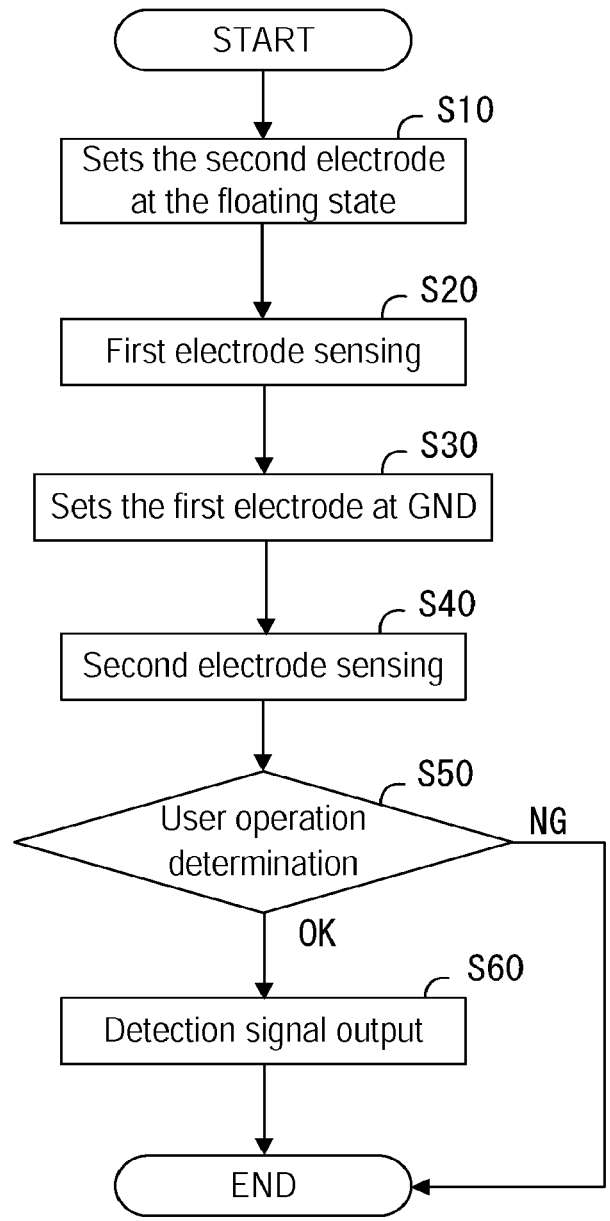
FIG. 4 is a flowchart illustrating a detection operation of the control apparatus of a door for a vehicle according to the first embodiment.

(Detection operation manner) A flowchart indicating a detection operation of the control apparatus U of the disclosure is illustrated in FIG. 4. At every predetermined sampling cycle, the control portion 3 switches between the first detection state in which the first sensor S1 including the first electrode 1 and the second sensor S2 including the second electrode 2 perform the detection, and the second detection state in which only the second sensor S2 performs the detection. The predetermined sampling cycle may be set arbitrarily, and is decided in consideration of times when the detection operation in the first detection state and the detection operation in the second detection state are completed. In the embodiment, the sampling cycle is set at 16 ms, for example.

As illustrated in FIG. 4, first, the control portion 3 sets the drive circuit 5 to be in the first detection state. Specifically, as illustrated in FIG. 2A, the control portion 3 sets the second electrode 2 in the floating state (Step 10). In this state, the detection operation is performed with the use of the first electrode 1 and the second electrode 2 (Step 20). In the first detection state, the second electrode 2, which is in the floating state, does not become shield. Thus, the first detection region 1A, which is a wide area, is formed as the detection area.

In this state, an overall area of the sensor S increases, and thus a water bridge is easily generated between each of the electrodes and, for example, a door body especially in rains. Accordingly, the effect of further increasing the area of the electrodes of the sensor S is expected.

Next, in the second detection state in which the second electrode 2 is used, the first electrode 1 is grounded to, for example, the sliding door D1 as illustrated in FIG. 2B (Step 30 of FIG. 4), and the detection subject T which does not perform the opening and closing instruction of the sliding door D is detected. In the second detection state, the detection only by the second electrode 2 is performed (Step 40). Thus, the second detection subject T2 in the region away from the first electrode 1 is detected.

Thereafter, it is distinguished or determined whether the detection subject T that is detected is associated with the opening and closing operations of the sliding door D1 (OK at S50 of FIG. 4) or the detection subject T has simply approached the door handle H (NG at S50 of FIG. 4), and then a detection signal is outputted to cause the control portion 3 to perform the door opening and closing operation (Step 60).

In each of the first detection state and the second detection state, the approach and/or contact of the detection subject T is detectable. For enhancing a detection accuracy, a detection threshold value is set individually in the first detection state and in the second detection state. For example, the user positively or affirmatively performs the operation relative to the first electrode 1 in the first detection state, and thus an appropriate detection threshold value may be set on the basis of a prior examination result, for example.

On the other hand, in the second detection state, it is estimated that the detection subject T often approaches and/or is in contact with the entire region of the second detection region 2A as in a case where a person leans over the door handle H, for example. Thus, the existence of the detection subject T which is different from the operation of opening and closing command is effectively identified by setting the detection threshold value at a high value. Each of the detection threshold values in the first detection state and the second detection state may be set and/or changed arbitrarily.

Figure 5:
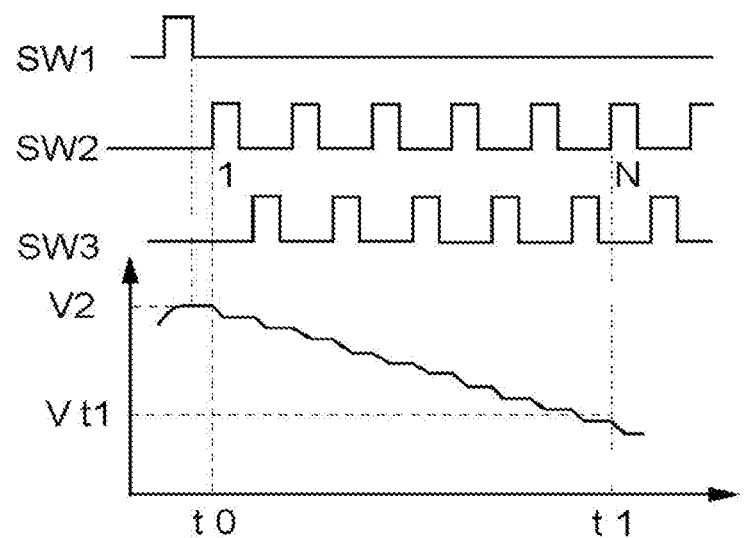
FIG. 5 is an explanatory diagram illustrating an operation manner of the drive circuit according to the first embodiment.

(Example of the operation of the drive circuit) How the first sensor S1 and the second sensor S2 perform the detection operation in the first detection state and the second detection state will be described with reference to FIGS. 3 to 5. On the detection operation, a switching control is performed in which a capacitance change amount of the first sensor S1 and the second sensor S2 (that is, an amount corresponding to a change amount of the electrostatic capacitance of the first sensor S1 and the second sensor S2) is detected.

First, in the first detection state, the second sensor S2 is set floated and the circuit at a side of the first sensor S1 is driven mainly. The fifth switch SW5 and the sixth switch SW6 are turned off, and thus the second sensor S2 comes to be in the floating state. A position of the fourth switch SW4 is arbitrary set. Thereafter, each of the first switch SW1 to the third switch SW3 is operated to switch in a predetermined manner.

In an initial period of the sampling cycle, the first switch SW1 is controlled to be in a closed state, and the second switch SW2 and the third switch SW3 are controlled to be in an open state. Thus, the first reference capacitor CB1 is initialized to include the equal potential to the potential V2 serving as the electric power source, that is, to include an initial potential.

Next, the first switch SW1 is controlled to be in an open state, and the second switch SW2 and the third switch SW3 are opened and closed alternately with each other. Thus, the intermediate potential VM gradually decreases at and after a start time t0 of the sampling period. When the intermediate potential VM comes to a value which is smaller than the first set potential Vt1, the first determination apparatus CP1 outputs the completion signal to the control portion 3.

The control portion 3 counts a switching number N that is the number of times of the switchings of the second switch SW2 or the third switch SW3 which are performed from the start time t0 to a time t1. The start time t0 is the time at which the alternate openings and closings of, for example, the second switch SW2, are started, and the time t1 is a time at which the intermediate potential VM falls below the first set potential Vt1 and the sampling is completed.

Further, the control portion 3 calculates a switching number difference ΔN corresponding to a difference between a switching number N1 and a switching number N2 of two of the sampling cycle. The switching number difference ΔN is a value corresponding to the change amount of the electrostatic capacitance of the first sensor S1, and serves as an index indicating that the detection subject T has approached and/or touched the first sensor S1. The control portion 3 compares a magnitude relationship of the switching number difference ΔN and a set value ΔNB obtained in advance via, for example, experiment with each other. If Switching number difference ΔN>Set value ΔNB, it is determined that the detection subject T has touched and/or approached the first sensor S1.

Instead of performing the successive two samplings, a switching number NB serving as a reference may be stored in the control portion 3, and the stored switching number NB and the switching number N obtained from the sampling may be compared with each other.

Next, the control portion 3 sets the drive circuit 5 in the second detection state. In the second detection state, the first sensor S1 is grounded to the sliding door D1, for example, and the drive circuit at a side of the second sensor S2 is driven. The second switch SW2 is turned off and the third switch SW3 is turned on, and thus the first sensor S1 is in the grounded state. A position of the first switch SW1 is arbitrary set. Thereafter, each of the fourth switch SW4 to the sixth switch SW6 is operated to switch in a predetermined manner similarly to the above-described example of the first detection state.

The control portion 3 performs the above-described sampling operations by the first sensor S1 and the second sensor S2 alternately, and detects the state of approach of, for example, a finger of the person relative to the door handle H.

(Material) For example, each of the first electrode 1 and the second electrode 2 may be formed of electric wire material, metal material or conductive substrate. The above-stated materials are easily processed to include various shapes and configurations. Also, the above-stated materials are easily obtainable, and thus the control apparatus U can be prepared at low costs.

Figure 6:
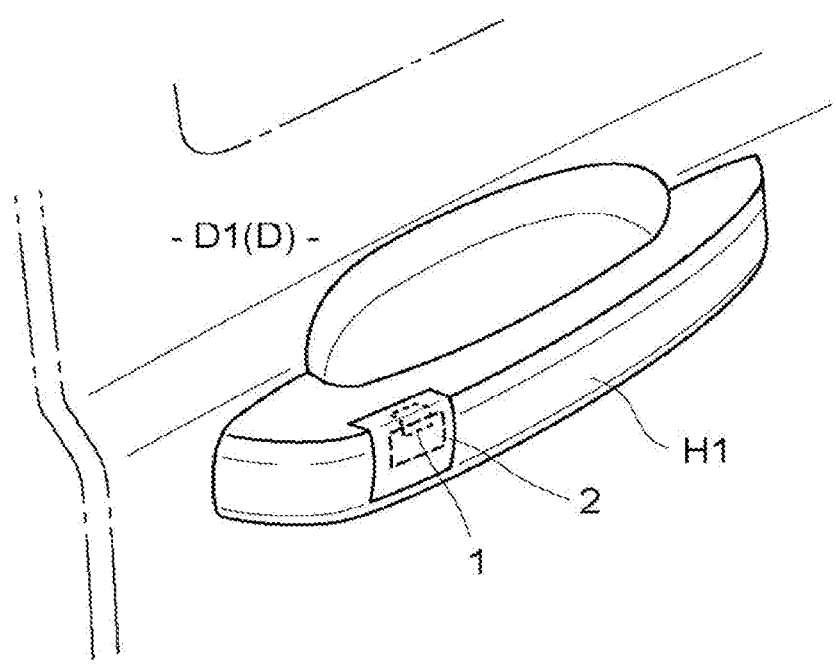
FIG. 6 is an explanatory diagram illustrating a configuration of a control apparatus of a door for a vehicle according to a second embodiment disclosed here.

(Second embodiment) The first electrode 1 and the second electrode 2 may include an outer shape in which the second electrode 2 projects at only one side of the first electrode 1 as illustrated in FIG. 6. For example, in a case where the door handle H is provided at a protruding portion of the sliding door D1, the protruding portion which is formed at a surface of the sliding door D1 at an upper position of the sliding door D1 to extend in the horizontal direction, a position of the sliding door D1 with which a hand and/or a body of the user is in contact may be limited to a lower region relative to the door handle H. In this case, when the finger and so forth approaches the door handle H to give the command of the opening and closing action of the door, the action may be performed in such a manner that the finger is placed on the door handle H from a slightly upper side of the door handle H.

In the above-described case, the outer shape may be applicable in which the first electrode 1 is deflected upwards to an upper position and the second electrode 2 projects only downwards relative to the first electrode 1.

According to the above-described structure, particularly the shape and configuration of the second electrode 2 is simplified compared to the first embodiment, and thus the control apparatus U of a door for a vehicle can be obtained at lower costs.

(Other embodiment) The control apparats of a door for a vehicle of the present disclosure is applicable in a manner that the sensor S is provided at a door handle H2 of a swing door D2 of a front seat of the vehicle illustrated in FIG. 1A and the control apparatus controls the opening and closing operations of the door that opens and closes by swinging.

Figure 7:
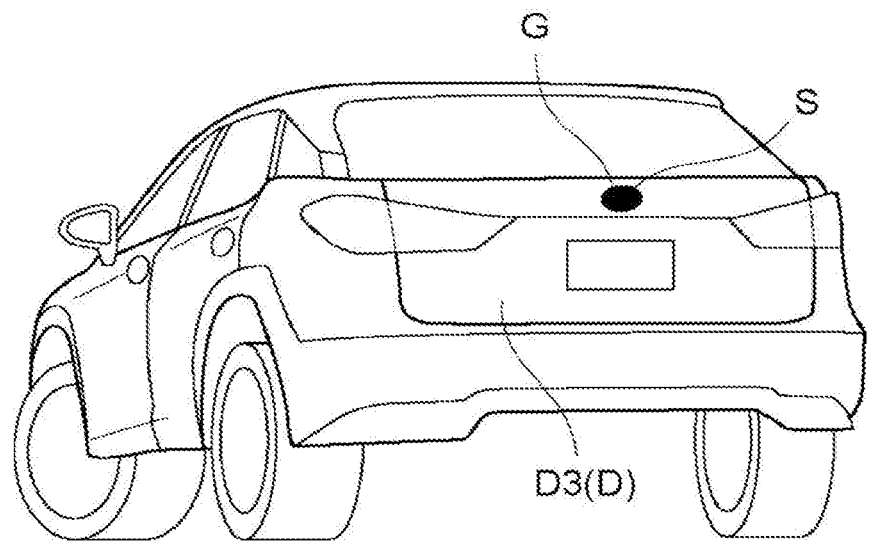
FIG. 7 is an explanatory diagram illustrating a configuration of a control apparatus of a door for a vehicle according to another embodiment disclosed here.

As illustrated in FIG. 7, the sensor S may be provided at a garnish G of a back door D3 and the control apparats of a door for a vehicle of the present disclosure may control opening and closing operations including raising and lowering actions of the back door D3.

The control apparatus disclosed here is widely applicable to a control apparatus of a door for a vehicle configured to detect the approach of a finger and/or a hand of a person, including the detection of opening and closing of a swing door by an electrostatic sensor provided at a door handle and/or the detection of opening and operation of a back door by an electrostatic sensor provided at a garnish, for example.

The present disclosure is related to the control apparatus of a door for a vehicle that includes the two electrostatic sensor electrodes provided to face the outer side of the door for the vehicle, and the control portion configured to control the electrodes. The control apparatus is configured to detect the opening and closing instruction of the door that is made by the user.

According to the aforementioned embodiment, the control apparatus U of a door for a vehicle includes the first electrode 1 corresponding to the electrostatic sensor electrode including the first detection surface 1F facing the outer side of a door D, D1, D2, D3 for a vehicle, and the second electrode 2 opposing the first electrode 1 being positioned at the outer side of the door for the vehicle relative to the first detection surface 1F, and facing the outer side of the door for the vehicle. The second electrode (2) corresponds to the electrostatic sensor electrode including the second detection surface 2F including the overlapping region which overlaps with the first detection surface 1F along the surface directions of the first detection surface 1F and the second detection surface 2F, and the non-overlapping region which does not overlap with the first detection surface 1F. The control apparatus U includes and the control portion 3 configured to control the first electrode 1 and the second electrode 2, wherein the control apparatus U configured to switch between the first detection state in which the first electrode 1 is driven and the electric potential of the second electrode 2 is at a float, and the second detection state in which the second electrode 2 is driven and the electric potential of the first electrode 1 is in a grounded state, and the control apparatus U is configured to identify the action instruction to the door D, D1, D2, D3 for the vehicle on the basis of the electrostatic capacitance value measured at the first electrode 1 and the second electrode 2.

According to the above-described configuration, the control apparatus U of a door for a vehicle is configured such that the first electrode 1 which serves as the electrode for detection detects the action instruction made by the user relative to the door for the vehicle, and the second electrode 2 which serves as the electrode for prohibition detects the contact state in which, for example, the user touches the door for the vehicle accidentally or by mistake.

Accordingly, when the first electrode 1 is driven, the second electrode 2 is floated to prevent the second electrode 2 from becoming shield. Thus, the first electrode 1 and the second electrode 2 are allowed to be at the same potential due to the effect of the overlapping region of the first electrode 1 and the second electrode 2, thereby practically increasing the area of the first electrode and enhancing a sensing sensitivity of the first electrode 1. As a result, the opening and closing instruction action made to the door for the vehicle by the user is easily detected.

On the other hand, the first electrode 1 is in the grounded state when the second electrode 2 is driven, and thus only the second electrode 2 is in a state of including the detection sensitivity. Thus, in a state where only the second electrode 2 is touched but the first electrode 1 is not touched, for example, the state which includes a case where a person in the vicinity of the vehicle comes in contact with the door for the vehicle accidentally or by mistake, the action of the door for the vehicle is prohibited for the reason that the person does not have an intention to open or close the door for the vehicle.

According to the above-described configuration, for example, in rains, the second electrode 2 arranged at the outer side of the door for the vehicle relative to the first electrode 1 may electrical bridge with other portion different from the sensor, the other portion which includes a door body, for example, and thus may increase its apparent area. As a result, in a case where the user unintentionally touches the door for the vehicle, the user generally often touches a region of the door for the vehicle of which an area is large. Thus, a detection sensitivity of a state in which the action of the door for the vehicle is prohibited may be enhanced.

Further, according to the above-described configuration, a size of the sensor may be reduced since the first electrode 1 and the second electrode 2 are arranged to be overlapped with each other.

According to the aforementioned embodiment, the dielectric 4 is provided at at least part of the overlapping portion in which the first electrode 1 and the second electrode 2 are overlapped with each other.

According to the above-described configuration, the dielectric 4 is arranged at the portion in which the first electrode 1 and the second electrode 2 are overlapped with each other. Thus, the first electrode 1 and the second electrode 2 easily come to be equipotential to each other via the dielectric 4 in the first detection state in which the first electrode 1 is driven and the second electrode is in the floating state. Consequently, an actual area of the electrodes in the first detection state increases, thereby allowing an easy detection of the opening and closing action of the door D, D1, D2, D3 for the vehicle that is made by the user.

According to the aforementioned embodiment, the dielectric 4 corresponds to an air layer.

According to the above-described configuration, the air layer 4 serving as the dielectric body 4 is disposed at the overlapping portion of the first electrode 1 and the second electrode 2. Accordingly, in the first detection state in which the first electrode 1 is driven and the second electrode 2 is in the floating state, the first electrode 1 and the second electrode 2 come to at the same potential as each other easily via the air layer serving as the dielectric 4. Consequently, the actual area of the electrodes in the first detection state increases, and thus the opening and closing action of the door D, D1, D2, D3 for the vehicle that is made by the user is easily detected.

According to the aforementioned embodiment, the overlapping area of the first detection surface 1F and the second detection surface 2F is equal to or greater than one quarter of the area of the second detection surface 2F.

According to the above-described configuration, the overlapping area of the first detection surface 1F and the second detection surface 2F is set to be equal to or greater than one quarter of the area of the second detection surface 2F. Accordingly, in the first detection state, the first electrode 1 and the second electrode 2 come to at the same potential as each other easily. Consequently, the similar detection sensitivity can be obtained in the region surrounded by the overall outline of the first electrode 1 and the second electrode 2 combined with each other. Accordingly, the action instruction made by the user to the sliding door D, D1, D2, D3 for the vehicle is detectable more reliably.

According to the aforementioned embodiment, the distance L from the first detection surface 1F to the second detection surface 2F in the direction which is orthogonal to the overlapping direction of the first detection surface 1F and the second detection surface 2F is equal to or smaller than 5 mm.

To make the first electrode 1 and the second electrode 2 to be at the same potential as each other in the first detection state, the shorter the distance between the both electrodes, the more efficiently the electrodes come to be at the same potential as each other. According to the above-described configuration, the distance between the first detection surface 1F and the second detection surface 2F is set to be equal to or smaller than 5 mm so that the both electrodes come to be at the same potential as each other easily.

According to the aforementioned embodiment, the outer shape of each of the first electrode 1 and the second electrode 2 corresponds to rectangular, and the second electrode 2 surrounds two or more sides of the first electrode 1.

According to the above-described configuration, in a case where the outer shape of the first electrode 1 and the second electrode 2 includes the rectangular configuration, and the second electrode 2 surrounds two or more sides of the first electrode 1, much region of the first electrode 1 overlaps with the second electrode 2. Consequently, also in this case, the first electrode 1 and the second electrode 2 come to be at the same potential as each other easily.

According to the aforementioned embodiment, each of the first electrode 1 and the second electrode 2 is formed of electric wire material, metal material or conductive substrate, for example.

According to the above-described configuration, for example, the electrical wire material, the metal material or the conductive substrate can be processed into various shapes and configuration, and are easily obtainable. Accordingly, the control apparatus U of a door for a vehicle can be prepared at low costs.

According to the aforementioned embodiment, the outer shape of each of the first electrode 1 and the second electrode 2 corresponds to rectangular.

In a case where the control apparatus U of a door for a vehicle disclosed here is configured such that the outer shape of each of the first electrode 1 and the second electrode 2 is rectangular, the second electrode 2 does not need to include the ring shape, thereby simplifying the shape and configuration.

The principles, preferred embodiments and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A control apparatus of a door for a vehicle, the control apparatus comprising:
    a first electrode corresponding to an electrostatic sensor electrode including a first detection surface facing an outer side of the door for the vehicle;
    a second electrode opposing the first electrode, being positioned at an outer side of the door for the vehicle relative to the first detection surface, and facing the outer side of the door for the vehicle, the second electrode corresponding to an electrostatic sensor electrode including a second detection surface including an overlapping region which overlaps with the first detection surface along surface directions of the first detection surface and the second detection surface, and a non-overlapping region which does not overlap with the first detection surface; and
    drive circuitry configured to:
        control the first electrode and the second electrode,
        switch between a first detection state in which the first electrode is driven and an electric potential of the second electrode is at a float, and a second detection state in which the second electrode is driven and an electric potential of the first electrode is in a grounded state, and
        identify an action instruction to the door for the vehicle on a basis of an electrostatic capacitance value measured at the first electrode and the second electrode.

2. The control apparatus of the door for the vehicle according to claim 1, wherein a dielectric is provided at at least part of an overlapping portion in which the first electrode and the second electrode are overlapped with each other.

3. The control apparatus of the door for the vehicle according to claim 2, wherein the dielectric corresponds to an air layer.

4. The control apparatus of the door for the vehicle according to claim 2 wherein an overlapping area of the first detection surface and the second detection surface is equal to or greater than one quarter of an area of the second detection surface.

5. The control apparatus of the door for the vehicle according to claim 4, wherein a distance from the first detection surface to the second detection surface in a direction which is orthogonal to an overlapping direction of the first detection surface and the second detection surface is equal to or smaller than 5 mm.

6. The control apparatus of the door for the vehicle according to claim 4, wherein an outer shape of each of the first electrode and the second electrode corresponds to rectangular, and the second electrode surrounds two or more sides of the first electrode.

7. The control apparatus of the door for the vehicle according to claim 4, wherein each of the first electrode and the second electrode is formed of electric wire material, metal material or conductive substrate.

8. The control apparatus of the door for the vehicle according to claim 2, wherein a distance from the first detection surface to the second detection surface in a direction which is orthogonal to an overlapping direction of the first detection surface and the second detection surface is equal to or smaller than 5 mm.

9. The control apparatus of the door for the vehicle according to claim 2, wherein an outer shape of each of the first electrode and the second electrode corresponds to rectangular, and the second electrode surrounds two or more sides of the first electrode.

10. The control apparatus of the door for the vehicle according to claim 2, wherein each of the first electrode and the second electrode is formed of electric wire material, metal material or conductive substrate.

11. The control apparatus of the door for the vehicle according to claim 2, wherein an outer shape of each of the first electrode and the second electrode corresponds to rectangular.

12. The control apparatus of the door for the vehicle according to claim 1, wherein an overlapping area of the first detection surface and the second detection surface is equal to or greater than one quarter of an area of the second detection surface.

13. The control apparatus of the door for the vehicle according to claim 12, wherein a distance from the first detection surface to the second detection surface in a direction which is orthogonal to an overlapping direction of the first detection surface and the second detection surface is equal to or smaller than 5 mm.

14. The control apparatus of the door for the vehicle according to claim 12, wherein an outer shape of each of the first electrode and the second electrode corresponds to rectangular, and the second electrode surrounds two or more sides of the first electrode.

15. The control apparatus of the door for the vehicle according to claim 12, wherein each of the first electrode and the second electrode is formed of electric wire material, metal material or conductive substrate.

16. The control apparatus of the door for the vehicle according to claim 12, wherein an outer shape of each of the first electrode and the second electrode corresponds to rectangular.

17. The control apparatus of the door for the vehicle according to claim 1, wherein a distance from the first detection surface to the second detection surface in a direction which is orthogonal to an overlapping direction of the first detection surface and the second detection surface is equal to or smaller than 5 mm.

18. The control apparatus of the door for the vehicle according to claim 1, wherein an outer shape of each of the first electrode and the second electrode corresponds to rectangular, and the second electrode surrounds two or more sides of the first electrode.

19. The control apparatus of the door for the vehicle according to claim 1, wherein each of the first electrode and the second electrode is formed of electric wire material, metal material or conductive substrate.

20. The control apparatus of the door for the vehicle according to claim 1, wherein an outer shape of each of the first electrode and the second electrode corresponds to rectangular.

* * * * *